United States Patent [19]

Brice et al.

[11] Patent Number: 4,541,073
[45] Date of Patent: Sep. 10, 1985

[54] NON-VOLATILE FLIP-FLOP WITH A STATIC RESETTING

[75] Inventors: Jean-Michel Brice; Patrick Maillart, both of Grenoble, France

[73] Assignee: Societe pour l'Etude et la Fabrication de Circuits Integres Speciaux, Grenoble, France

[21] Appl. No.: 425,511

[22] Filed: Sep. 28, 1982

[30] Foreign Application Priority Data

Nov. 20, 1981 [FR] France .................................. 81 21801

[51] Int. Cl.³ .............................................. G11C 11/40
[52] U.S. Cl. ..................................... 365/156; 365/185; 365/228
[58] Field of Search ............... 365/156, 228, 185, 181, 365/226

[56] References Cited

U.S. PATENT DOCUMENTS 4,090,259  5/1978  Wilcock et al. ................. 365/228 X
4,128,773  12/1978 Troutman et al. ................... 365/156
4,207,615  6/1980  Mar ........................................ 365/95

FOREIGN PATENT DOCUMENTS

A 2622307 12/1976 Fed. Rep. of Germany .

OTHER PUBLICATIONS

D. Frohman-Bentchkowsky, "The Metal-Nitride-Oxide-Silicon (MNOS) Transistor-Characteristics and Applications", pp. 1207-119, Proceedings of the IEEE, vol. 58, No. 8, Aug. 1970.

Primary Examiner—Joseph A. Popek
Attorney, Agent, or Firm—Oblon, Fisher, Spivak, McClelland & Maier

[57] ABSTRACT

A flip-flop further comprising two branches with MNOS elements serially connected with P channel MOS transistors for permitting a non-volatile storing of the informations comprised in the flip-flop at a chosen storing time. The memorization of the state of the flip-flop can be made in a single cycle by acting on the control signal applied to the gate of the P channel transistors and on the supply voltage of the device. In the same way, the resetting can be made in a single cycle.

4 Claims, 8 Drawing Figures 4,541,073

NON-VOLATILE FLIP-FLOP WITH A STATIC RESETTING

BACKGROUND OF THE INVENTION

The invention relates to safety integrated circuits and more specifically to a flip-flop, the content of which, at a given moment, can be stored in a non-volatile way into storage elements, the flip-flop being restorable according to the stored data.

The invention permits storage of information contained in a flip-flop if power is interrupted, and to resetting of the flip-flop one power is restored.

The invention relates more particularly to MOS type devices, that is devices comprising a conductive gate (for example a metal M) formed on an insulating layer (for example an oxide O) above a semiconductor (S).

SUMMARY OF THE INVENTION

The object of the safety circuit according to the invention is to fullfil the following features:
security of operation and in particular:
  writing in the non-volatile storage elements from the state of the flip-flop always being possible in any operation configuration,
  correct resetting of the flip-flop when power is restored from the state of the non-volatile storage element and only further to a precise command,
  non-perturbation of the flip-flop by the storage elements except during the resetting step,
simplicity of use:
  reduction of the number of specific controls necessary for the safety function,
  rapidity of the storing and resetting steps in particular as regards the memorization which has to be as short as possible.

For satisfying those requirements, the invention provides for a flip-flop having an associated safety circuit which permits flip-flop to have a non-volatile storage function, the control of the storing and the resetting steps being possible with only one control line.

For attaining this object, the invention provides for a non-volatile storage flip-flop comprising a classical MOS flip-flop, with complementary terminals Q and Q*, connected between a power voltage (VCC) and a reference voltage (M) to which two storage branches are added. Each of the storage branches comprises the serial connection of a non-volatile storing element in the form of an electrically programmable threshold voltage MOS transistor and a switching element of the MOS type. A terminal of each of the switching elements is connected to the power voltage. One of the main terminals and the control terminal of the storing element of the first branch are respectively connected with the Q and Q* terminals and conversely as regards the storing element of the second branch. The control terminals of the switching elements are interconnected with a control signal source. The control signal is applied to derive the following functions: normal operation of the flip-flop independently from the non-volatile storage circuit, memorizing of the state of the storing elements, storing, resetting the flip-flop, the variations of the control voltage being for some of those steps associated with variations in the power voltage.

The classical flip-flop can for example comprise complementary MOS transistors or enhanced and depleted MOS transistors. The storing elements can be MOS (metal-nitride-oxide-semiconductor) transistors, the substrate of which is connected with the source. Those storing elements can also be of the floating gate type. The switching transistors can be P channel insulated gate MOS transistors, the storing elements being of the N channel type. For permitting the operation of the non-volatile flip-flop according to the invention in its four steps, that is normal operation independently of any storage, memorizing, storage and resetting, the power voltage can vary between a first level permitting the classical operation of the flip-flop and a second level permitting modification of the threshold of the storing element. The power voltage is also liable to be removed, that is the reason for which a non-volatile storage is provided. The control signal applied to the switching elements can vary between a first value permitting to turn off the switching elements and a second value permitting to turn on those elements.

During the normal operation steps of the flip-flop, the power voltage is at the first level and the control signal at the first value. During the memorization steps, the power voltage is at the second level, the control signal remaining at the first value or following the second level. During the storage steps, the power voltage and the control signal are zero or floating. Finally, during the resetting steps, the power signal is restored to its first level while the control signal is first at the second value before growing to the first value for returning the normal operation state of the flip-flop.

According to an advantage of the invention, it will be noted that the storage elements are submitted to an operation cycle only when the content of the flip-flop is to be memorized. There is no change of state of those elements at each change of state of the flip-flop. This feature is of importance, in particular when MNOS type transistors are used as storing elements, because the operating cycles of such MNOS transistors are limited to values in the range of $10^6$ to $10^8$ cycles.

The invention reaches the advantages enumerated above and also the advantage that the memorizing of the flip-flop contents is made in a particularly simple and quick way, by only one control cycle.

DESCRIPTION OF THE DRAWINGS

Those objects, features and advantages together with others of the invention will be explained in greater detail in the following description of preferred embodiments made in connection with the attached drawings wherein.

DESCRIPTION OF THE PREFERRED EMBODIMENTS

Figure 1:
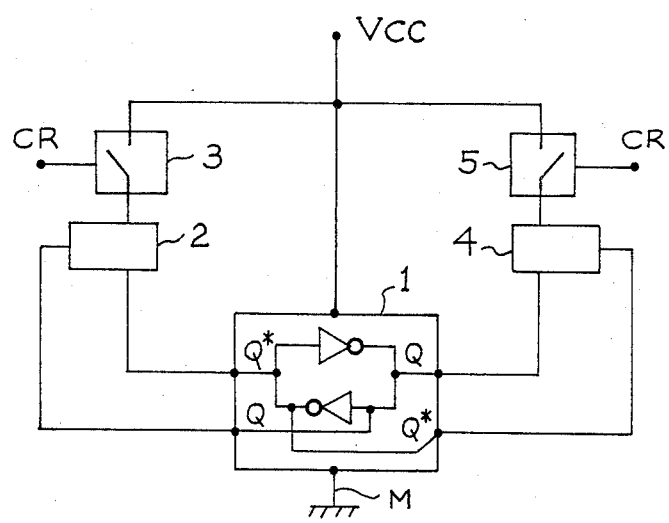
FIG. 1 is a schematic circuit diagram of a non-volatile flip-flop according to the invention.

In the drawings showing the flip-flops, the input/output conductors and peripherals of the flip-flop connected with the nodes Q and Q* have not been shown. They are carried out in a classical way.

FIG. 1 generally and schematically shows the circuit according to the inventin. This circuit comprises a classical bistable flip-flop 1 comprising complementary terminals or nodes Q and Q*, each of which can take the one or the other of two logical states, but never the same state. This flip-flop is connected between a power source VCC, for example 5 volts, and a reference voltage M, for example, ground. Accordingly, the two logical states Q and Q* correspond to the voltage VCC or to ground. In the normal flip-flop operation, the voltage VCC is usually of about 5 volts.

One assumes that the flip-flop 1 is of the volatile type, that is, if the power VCC is removed, the last state of the flip-flop is lost. For memorizing the last information before the removal of the power, two storing branches each comprising a storage element, respectively 2 and 4, and a controlled switch, respectively 3 and 5 are added to the flip-flop. These two branches are arranged between one of the flip-flop outputs and the power voltage VCC. The controlled switches 3 and 5 receive the same control voltage CR, that is they are simultaneously on or off. The storage elements 2 and 4 are MOS transistors with two electrically programmable threshold voltages and comprise two main terminals and a control terminal. The control terminal is connected with the node of the flip-flop complementary of the one which is connected to one of the main terminals.

For operating a safety operation, that is conditioning the storage elements 2 and 4, the power voltage VCC is increased immediately before the removal of the power. In case of a voluntary interruption of the power voltage, this is easy to make. In case of an undesigned interruption of the power voltage, there are known circuits for providing during a short time duration such a high voltage as soon as a lowering of the normal power voltage is detected, the source of high voltage being for example capacitors fed during the normal operation of the device. Accordingly, when the high voltage appears, it is applied between the nodes Q and Q* of the flip-flop and operates in an inverse way between the control terminal and one of the main terminals for each of the storing elements 2 and 4. If the programming threshold voltage of the storing elements is higher than the normal operation voltage of the flip-flop, which is generally the case in the usual devices, this permits setting the storing of elements 2 and 4 in complementary states. The way in which the memorized state in the storing elements 2 and 4 is used for resetting the flip-flop when the power is returned will be explained in detail hereinafter in connection with the description of a preferred embodiment of the invention in order to simplify the description.

The storing elements of the type "electrically programmable threshold voltage MOS transistors" are for example MNOS (metal-nitride-oxide-semiconductor) cells or floating gate transistors such as those currently called Flotox transisitors. Practically, the storing elements 2 and 4 are chosen among elements manufacturable in a compatible way with the elements constituting the bistable flip-flop 1. For example, if one uses floating grid transistors of the Flotox type, the more easily compatible technology is presently the MOS technology of the type with enhanced/depleted N channel MOS transistors. Alternatively, MNOS storing elements are presently compatible with the manufacturing of a CMOS flip-flop. This latter embodiment will be disclosed hereinafter as an example and a detailed description of the operation mode of the non-volatile storage flip-flop according to the invention will be disclosed in connection with this embodiment.

Figure 2:
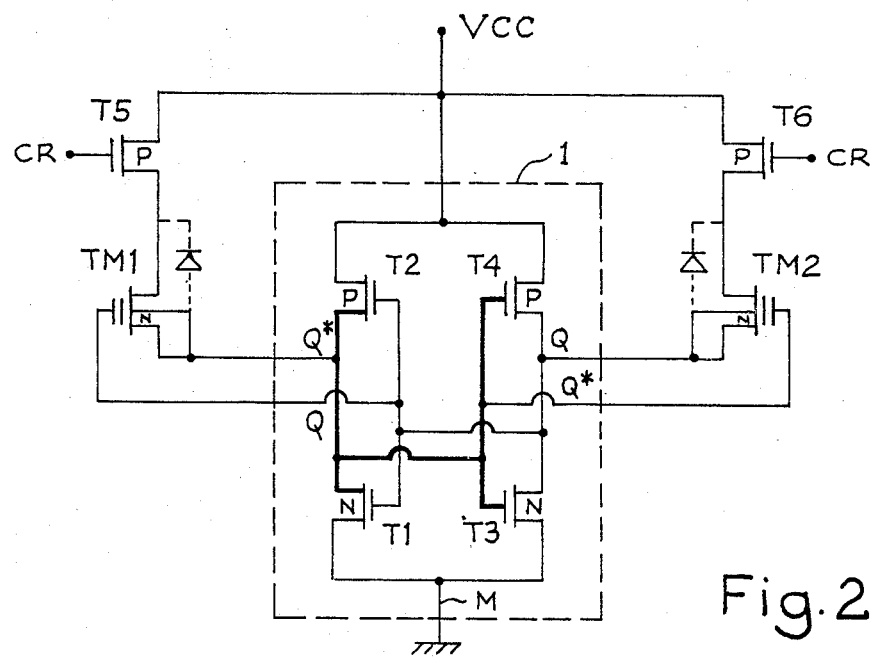
FIG. 2 is a circuit diagram of a first embodiment of a device according to the invention wherein the classical flip-flop comprises complementary MOS transistors.

In the embodiment shown in FIG. 2, the flip-flop 1 comprises complementary MOS transistors (CMOS). It comprises four transistors T1 to T4, the transistors T1 and T3 being of the N channel type and the transistors T2 and T4 of the P channel type. The transistors T1 and T2 are serially connected between the ground and the power voltage VCC. The transistors T3 and T4 are connected in the same way. The gates of transistors T1 and T2 are connected with the drain/source connection point of transistors T3 and T4 and the gates of transistors T3 and T4 are connected with the source/drain connection point of transistors T2 and T1. The terminal corresponding to the connection of the gates of the transistors T3 and T4 is designated by Q* and the connection of the gates of the transistors T1 and T2 is designated by Q.

The operation of this flip-flop, well known per se, will not be disclosed in detail here. To this flip-flop are added according to the invention two storing branches. The first branch connected to the node Q* comprises an MNOS element TM1 serially connected with a P channel MOS transistor T5, the other terminal of which is connected to the power voltage VCC. In the same way, the second branch, connected between the node Q and the power voltage VCC, comprises an MNOS element TM2 and a P channel transistor T6. The gates of the P channel transistors T5 and T6 are interconnected with a control signal source CR. The gate of the MNOS storing element TM1 is connected with the node Q and the gate of the element TM2 with the node Q*. The source and the substrate of each of the transistors TM1 and TM2 are interconnected respectively with the node Q* and the node Q. Stray diodes appearing between the substrate and drain terminals of transistors TM1 and TM2 are also shown in FIG. 2.

Figure 3:
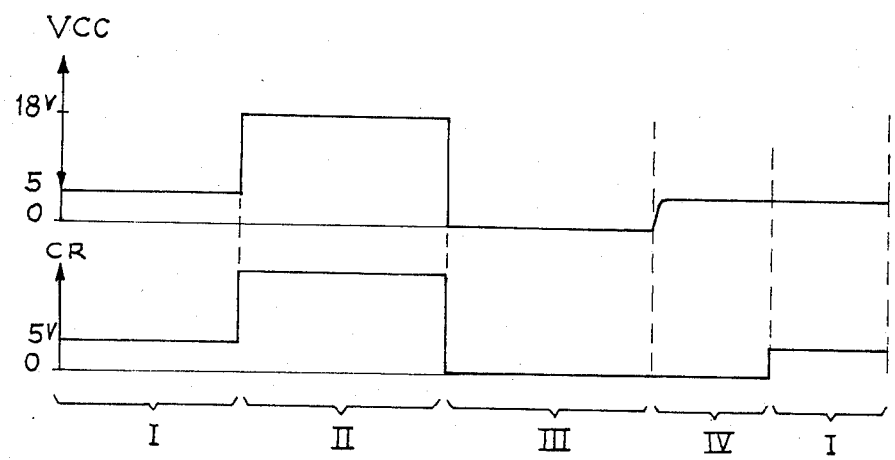
FIG. 3 is a waveform diagram illustrating the voltages applied to the device during the various operating steps.

The operation of this device will be disclosed in connection with FIG. 3 which shows the voltage applied to the supply terminal VCC and the control terminal CR.

In the step I of normal operation, the voltage VCC is the normal operation voltage of the flip-flop, for example 5 volts. The control signal CR is at a high level, for example 5 volts like VCC, in order that the transistors T5 and T6 are turned off. In this configuration, the voltage applied between gate and source-substrate of the elements TM1 and TM2 is more or less 5 volts, that is not enough to change the threshold state of those elements. Thus, due to the turn off of transistors T5 and T6, the storing branches have practically no influence on the operation of the flip-flop. Their only influence resides in the supplementary capacitance at the nodes Q and Q* due to the presence of the MNOS elements. According to an important feature of the invention, it will be noted that the 5 volts voltage applied to the MNOS elements during changes of states of the flip-flop which do not induce a programming of those elements, does not produce any ageing of those elements. In these conditions, the bistable flip-flop can present an unlimited number of state changes.

During the step II of memorizing the flip-flop state, the potential at the terminal VCC is momentarily raised to risen at a high level with respect to the reference voltage M, for example 18 volts, for acting on the threshold voltages of the MNOS elements. Simultaneously, the signal CR is risen to 18 volts, following the voltage VCC. In this state, a positive or negative voltage of 18 volts is applied between gate and source-substrate of the MNOS elements TM1 and TM2. Specifically, if we assume that Q* is high and Q low in the last state of the flip-flop, the elements TM1 has a voltage of 0 volt on its gate and 18 volts on its source and its substrate, while the element TM2 has a voltage of 18 volts on its gate and a voltage of 0 volt on its source and its substrate. Consequently, the element TM1 is programmed to its low threshold voltage and the element TM2 to its high threshold voltage. Therefore, for a gatesource voltage equal to 0, the element TM1 is in a depleted state, that is it is turned on (low impedance) between its drain and its source while the element TM2 is in an enhanced state, that is it is turned off (high impedance) between its drain and its source. This memorizing step occurs without any flow of static current because the transistors T5 and T6 are blocked. Thus, the power consumption of the circuit remains very low.

After this memorizing step, the normal operation of the device can be restored, the stored state in the MNOS elements possibly permitting to reset the flip-flop to its state existing at the time of the memorizing. But, usually, the memorizing step is followed with a storing step III during which the supply voltage VCC and the control signal CR are at a zero level or floating.

Figure 4:
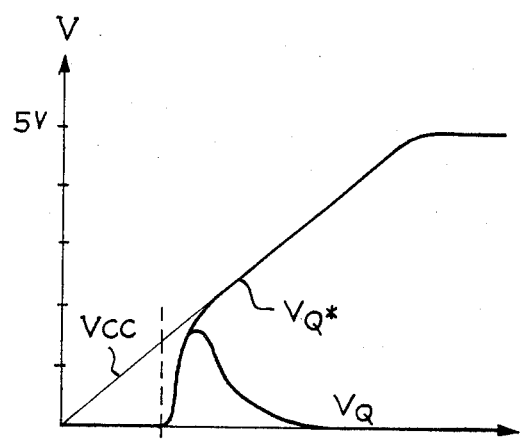
FIG. 4 is a graph illustrating the variation of the voltages applied to the device during the resetting of the flip-flop after a storage step.

For resetting the flip-flop, as shown during the step IV of FIG. 3, a supply voltage VCC is reapplied while the signal CR is maintained at zero. In the particular case described hereinabove, the element TM1 is in a conductive state and the element TM2 in a blocked state. While the VCC voltage increases the P channel transistors T2, T4, T5 and T6 remain turned off as long as their threshold voltage $V_{TP}$ is not reached. When the voltage VCC exceeds this value $V_{TP}$, the P channel transistors begin to conduct whereby the voltage at the nodes Q and Q* is raised. Then, due to the conductive state of the first storing branch (T5, TM1), the voltage at the node Q* follows the increase of the voltage VCC and causes an opposed voltage on the gates of the transistors T1 and T2 due to the operation of the flip-flop, that is the transistor T2 is turned off and the transistor T1 is turned on. The voltage at the node Q is low and the voltage at the node Q* is high. The variation of the voltages ($V_Q$ and $V_{Q*}$) with the variation of the voltage VCC is shown in greater detail in FIG. 4.

The operation during the resetting phase necessitates that the signal CR is maintained at 0 volt. This causes a problem in connection with the operation of the peripherals during the resetting step. In fact, it is difficult to make certain that a voltage remains null as long as the supply voltage has not reached at least the threshold voltage of the N channel transistors, that is, as long as no transistor is turned on. The output nodes Q and Q* are then in a state of high impedance and it is only the capacitive couplings which determine the voltage. Thus, although the disclosed device is of the static resetting type, the dynamic aspect must not be neglected in the limit cases where the offset introduced by the MNOS element is low. In particular, the nodes Q and Q* can follow VCC through the stray diodes, transistor capacitors, and stray capacitances. The value of the rise time of the voltage VCC has to be considered. If the rising time is long, the capacitive aspect can be neglected.

As regards technology, the circuit disclosed in FIG. 2 can be implemented using CMOS technology on bulk or on an insulating substrate. In case of an insulating substrate, each of the transistors is naturally isolated. In case of a bulk technology, the N channel transistors T1 and T3 and the MNOS N channel elements TM1 and TM2 are implanted into P type islands. Those islands are connected either to ground or to the source of the N channel transistors included in those islands, as shown in the drawing. The stray diode island/substrate has a given junction capacitance; i ts breakdown voltage is higher than the voltages aplied to the circuit and its stray current is negligible.

Some variations of the above embodiment, permitting to improve some features of the flip-flop and in particular its security of operation during the restoring step will be disclosed hereafter.

Figure 5:
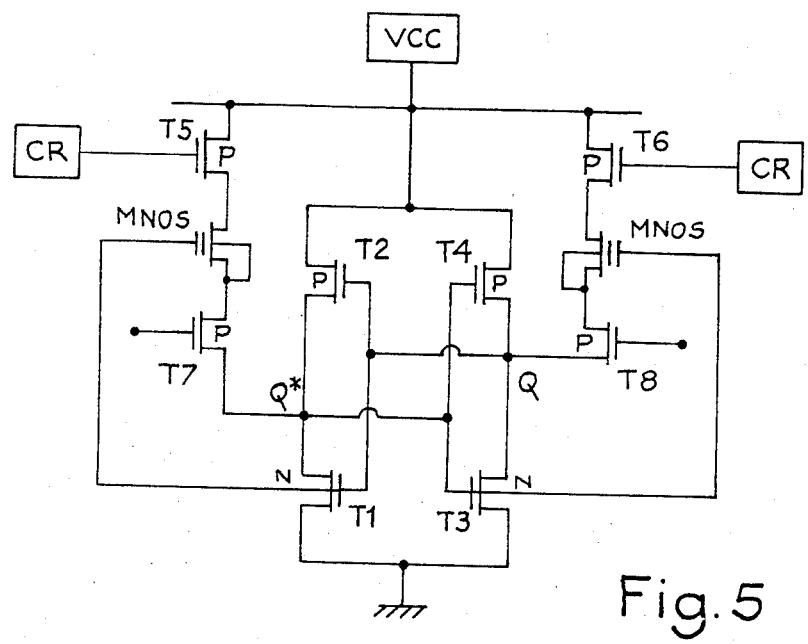
FIGS. 5 to 7 are circuit diagrams illustrating variations of the first embodiment.

In the variation shown in FIG. 5, the circuit is generally identical to the one of FIG. 2, but two P channel transistors T7 and T8 have been added, respectively between the source of MNOS transistors TM1 and TM2 and nodes Q* and Q. The action during the different steps on the supply voltage VCC and the signal source CR is identical to the one of FIG. 2. The transistors T7 and T8 are blocked during the normal operation phase of the flip-flop and permit accordingly to reduce the capacitive charge applied onto the nodes Q and Q* by insulating those nodes with respect to the MNOS elements. The control signal on the gates of transistors T7 and T8 is identical to the control signal CR during all the steps except during the memorizing step II during which those transistors have to be conducting. In this variant, the dynamic features of the flip-flop are improved but two additional transistors and a specific control line are added.

Figure 6:
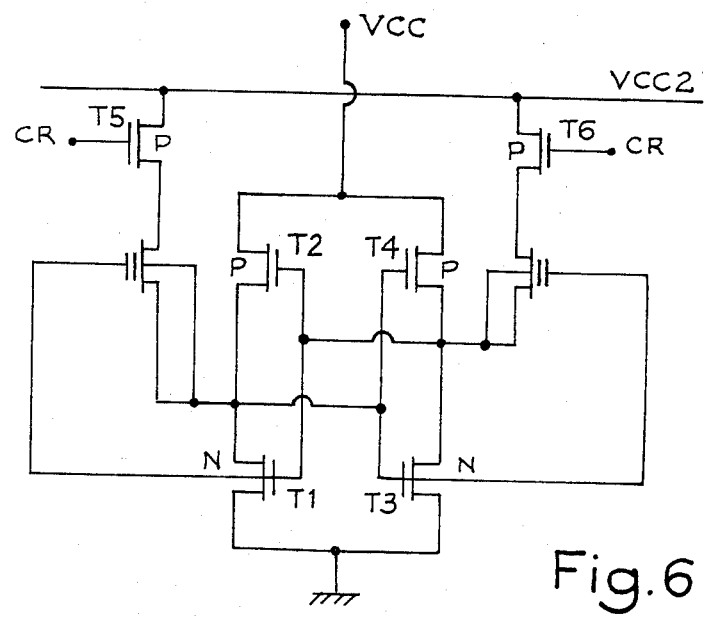

A second variation is shown in FIG. 6. The circuit is generally identical to the one of FIG. 2 but distinct supply lines are provided for the supply VCC of the flip-flop and the supply VCC2 of the storing branches. The object of this variation is to improve the operation security, that is mainly during the resetting phase by eliminating the action of the loads T2 and T4 of the flip-flop during the resetting. Then, the storing branches constitute the loads. During the resetting step IV, the voltage VCC first remains floating while the voltage VCC2 increases. Thereby, no current can circulate in the loads during the resetting of the flip-flop. Only once the flip-flop is reset (VCC2 attains 5 volts for example), the voltage VCC is raised to its nominal value (also 5 volts for example), connecting at this moment the loads of the bistable flip-flop. Once the resetting is made, as the control signal CR turns off the P channel transistors T5 and T6, the value of the voltage VCC2 does not matter as long as it is not higher than VCC.

Figure 7:
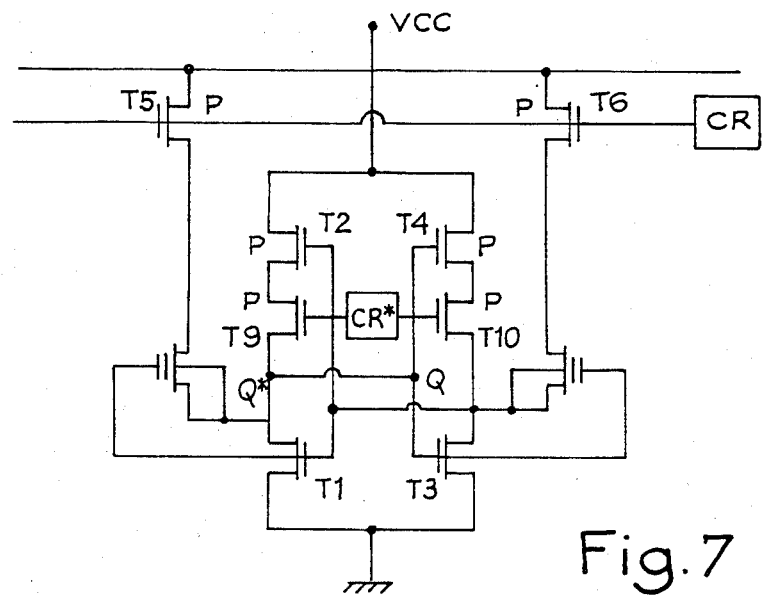

A third variation, shown in FIG. 7, has the same purpose as the second variation, that is to isolate a load. The circuit is generally identical to the one of FIG. 2, but two transistors T9 and T10 are inserted respectively between the transistors T1 and T2 on the one hand, and T3 and T4 on the other hand. Those transistors are controlled by a control signal CR* complementary with respect to the signal CR. Thus, during the first part of the rising of the voltage VCC during the restoring, the signal CR is maintained at 0 volt for having the transistors T5 and T6 turned on while the signal CR* follows the voltage VCC for turning off the transistors T9 and T10 as soon as the voltage VCC exceeds the threshold voltage of the P channel transistors. The loads constituted by the transistors T2 and T4 are accordingly isolated with respect to the nodes Q and Q* and the MNOS elements control the voltage of those nodes according to their threshold voltage (their conductivity state).

Figure 8:
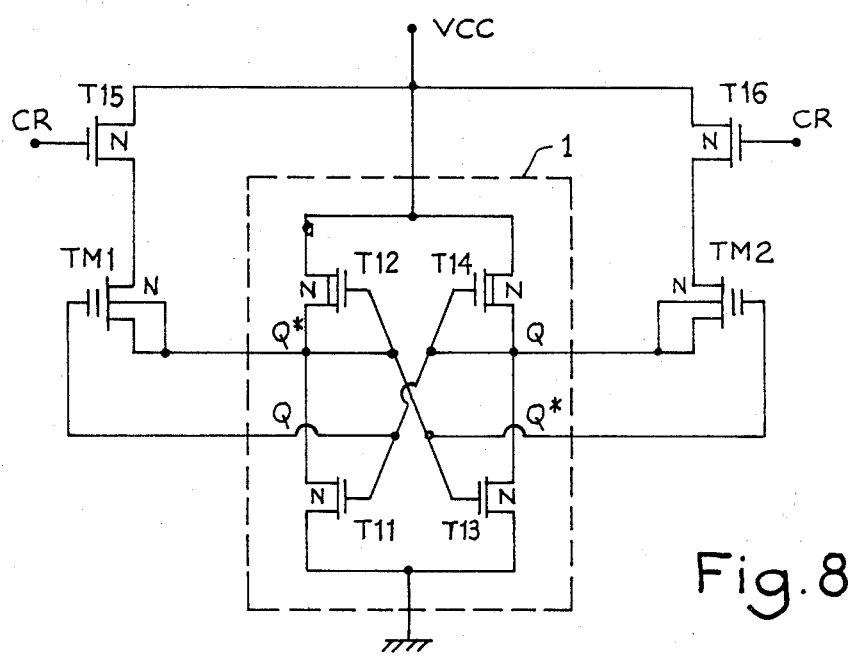
FIG. 8 is a circuit diagram of a second embodiment of the device according to the invention wherein the classical flip-flop comprises enhanced/depleted MOS transistors.

FIG. 8 shows another embodiment of the invention wherein the classical flip-flop 1 no longer comprises complementary MOS transistors but an association of enhanced and depleted MOS transistors. This flip-flop comprises four N channel transistors T11 to T14. The transistors T11 and T12 are serially connected like the transistors T13 and T14. The transistors T11 and T13 are of the enhanced type, that is they are normally off, and the transistors T12 and T14 are of the depleted type, that is they are normally on. The gates of transistors T12 and T13 are connected the one to the other and to the drain/source junction of transistors T11 and T12. The gates of transistors T11 and T14 are interconnected with the drain/source connection of transistors T13 and T14.

The storing branches and the storing elements are connected as formerly disclosed in connection with FIG. 2. The bistable flip-flop shown in FIG. 8 is known per se. It has been described herein only for emphasizing the fact that the invention is not limited to the use of a specific type of flip-flop. For increasing the operation security, it is possible to use the variation of FIG. 6 with this type of technology because the normal loads of the cell (T12, T14) are turned on immediately when the threshold voltage VCC increases and disturbs the resetting. It is therefore desirable to isolate those depleted loads during the resetting. In case the classical flip-flop uses a combination of enhanced/depleted N channel transistors, it is presently technologically simple to associate with such a flip-flop floating gate transistors constituting the storing elements TM1 and TM2.

In the above discussion, a flip-flop associated with two storing branches for obtaining a non volatile function has been described. The classical flip-flop above disclosed was of the symmetrical type and had to be as symmetrical as possible for operating satisfactorily even when the distance between the two thresholds of the storing elements TM1 and TM2 decreases while those devices become aged. It would also be possible to provide for an asymmetrical flip-flop which is automatically reset on a given state in the absence of storing branches and to associate to such an asymmetrical flip-flop a single storage branch permitting to reset this flip-flop in its other state when the storing element associated with this flip-flop is in its low impedance state. The control mode of such an asymmetrical flip-flop is identical to the one formerly disclosed. The advantage of this structure lies in the diminution of the used surface of silicon but the drawback is that the asymmetrical flip-flop is less sensible than a symmetrical one which means in particular that such a flip-flop necessitates for presenting a satisfactory operation a larger difference between the off-state and the on-state of the MNOS elements.

The variations disclosed above are only examples of modifications which can be made to the basic circuit shown in a particular way in FIG. 2 and, more generally, in FIG. 1. Of course, other variations can be provided without departing from the scope of the invention and, in particular, the variations disclosed can be combined.

What is claimed is:

1. A non-volatile storage device comprising:
    a MOS flip-flop circuit having complementary first and second outputs, a reference terminal and a supply terminal;
    first and second storage branches each comprising a series circuit of a non-volatile storage element and a switching element, said non-volatile storage element comprising a MOS transistor having an electrically programmable threshold voltage;
    the storage element of said first storage branch connected at one end of said first storage branch to said first output of said flip-flop circuit and having a control electrode connected to said second output of said flip-flop circuit;
    the storage element of said second storage branch connected at one end of said second storage branch to said second output of said flip-flop circuit and having a control terminal connected to said first output of said flip-flop circuit; and,
    said switching elements of said storage branches being connected to said supply terminal at an other end of each said storage branches and having a control electrode for controlling conduction or blocking thereof.

2. A non-volatile storage device according to claim 1, comprising:
    means for applying during a normal operation of said flip-flop circuit a first supply voltage of said supply terminal and a blocking signal to said control electrodes of said switching elements for blocking said switching elements;
    means for applying during a writing phase a second supply voltage higher than said first supply voltage to said supply terminal, and a blocking signal to said control electrodes of said switching elements; and,
    means for applying during a reset phase a conduction signal to said control electrodes of said switching elements for driving said switching elements in a conductive state and a variable voltage, increasing from zero to said first supply voltage, between said reference terminal and said supply terminal.

3. A non-volatile storage device comprising:
    a MOS flip-flop circuit having complementary first and second outputs, a reference terminal and a supply terminal;
    first and second storage branches each comprising a series circuit of a non-volatile storage element and a switching element, said non-volatile storage element comprising a MOS transistor having an electrically programmable threshold voltage;
    the storage element of said first storage branch connected at one end of said first storage branch to said first output of said flip-flop circuit and having a control electrode connected to said second output of said flip-flop circuit;
    the storage element of said second storage branch connected at one end of said second storage branch to said second output of said flip-flop circuit and having a control terminal connected to said first output of said flip-flop circuit; and,
    said switching elements of said storage branches being connected to a writing line at an other end of each said storage branches and each having a control electrode for controlling conduction or blocking thereof.

4. A non-volatile storage device according to claim 3, comprising:
- means for applying during a normal operation of said flip-flop circuit a first supply voltage to said supply terminal and a blocking signal to said control electrodes of said switching elements for blocking said switching elements;
- means for applying during a writing phase a second supply voltage higher than said first supply voltage to said supply terminal and to said writing line, and a blocking signal to said control electrodes of said switching elements; and,
- means for applying during a reset phase a conduction signal to said control electrodes of said switching elements for driving said switching elements into a conductive state, said reset phase having a first part in which said supply terminal is left in a high impedance floating state while the writing line is driven from a zero voltage up to said first supply voltage, and a second part in which said supply terminal is driven to said first supply voltage.

* * * * *